United States Patent [19]

Barnes et al.

[11] Patent Number: 5,535,507
[45] Date of Patent: Jul. 16, 1996

[54] METHOD OF MAKING ELECTROSTATIC CHUCK WITH OXIDE INSULATOR

[75] Inventors: Michael S. Barnes, San Francisco, Calif.; John H. Keller, Newburgh, N.Y.; Joseph S. Logan, Jamestown, R.I.; Raymond R. Ruckel, Garrison, N.Y.; Robert E. Tompkins, Pleasant Valley, N.Y.; Robert P. Westerfield, Jr., Montgomery, N.Y.

[73] Assignee: International Business Machines Corporation, Armonk, N.Y.

[21] Appl. No.: 169,911

[22] Filed: Dec. 20, 1993

[51] Int. Cl.⁶ .................................................... H01R 43/00
[52] U.S. Cl. .................................. 29/825; 269/8; 361/234
[58] Field of Search ........................ 29/825, 829; 156/345

[56] References Cited

U.S. PATENT DOCUMENTS

| | | |
|---|---|---|
| 3,993,123 | 11/1976 | Chu et al. . |
| 5,055,964 | 10/1991 | Logan et al. . |
| 5,213,349 | 5/1993 | Elliott ..................................... 279/128 |
| 5,350,479 | 9/1994 | Collins et al. . |
| 5,384,682 | 1/1995 | Watanabe et al. . |

FOREIGN PATENT DOCUMENTS

| | | |
|---|---|---|
| 0452222 | 11/1991 | European Pat. Off. . |
| 0473930 | 3/1992 | European Pat. Off. . |
| 2455360 | 11/1980 | France . |

OTHER PUBLICATIONS

Makoto S., "Electrostatic Chuck Apparatus", Patent Abstracts of Japan, Application No. JP1251735, E–868, vol. 14 No.2, Oct. 6, 1989.

Primary Examiner—Carl J. Arbes

[57] ABSTRACT

An electrostatic chuck is made by a method in which the component parts are machined, then anodized to provide a hard insulating surface, and then assembled in a fixture, to provide a planar surface for wafer support that retains superior insulating properties; gas may be fed from the rim only, diffusing within interstices between the clamping surface and the wafer and maintaining a desired pressure by flowing radially through an impedance determined by the average spacing between clamping surface and wafer, thereby providing uniform pressure across the clamping surface without the use of elastomeric seals.

8 Claims, 8 Drawing Sheets

METHOD OF MAKING ELECTROSTATIC CHUCK WITH OXIDE INSULATOR

TECHNICAL FIELD

The field of the invention is that of electrostatic chucks for holding a workpiece by electrostatic attraction between the workpiece and one or more electrodes in the chuck.

BACKGROUND ART

Extensive work has been done in electrostatic chucks within the last ten years. An example is the chuck illustrated in U.S. Pat. No. 5,055,964, issued to the International Business Machines Corporation. The chuck disclosed herein is an improvement on that chuck. Another indication of work in wafers is an article in the IBM Technical Disclosure Bulletin Vol. 19, No. 6, November 1976 entitled "Gas Cooling". U.S. Pat. No. 3,993,123 illustrates the use of gas to conduct heat between abutting surfaces, the gas being present in the irregularities between two nominally flush surfaces and permeating the available space by diffusion from a low impedance supply area. The gas pressure is nominally atmospheric, well above a transition value characterized by the equivalence of the mean free path of the gas and the average distance between the surfaces.

A problem familiar to those in the art is the manufacture of a chuck that can withstand the hostile environment of plasma etch apparatus in which corrosive gases and high temperature will rapidly destroy chucks that have plastic insulators.

Another problem is that of fabricating a planar surface to support a semiconductor wafer and forming passages for the flow of coolant gases in the planar surface while avoiding electric breakdown through the dielectric coating between the two electrodes of a bipolar chuck such as that disclosed in the patent cited above.

SUMMARY OF THE INVENTION

The invention relates to an electrostatic chuck and method of manufacture of the chuck in which the component parts are machined, then anodized to provide a hard insulating surface, and then assembled in a fixture, to provide a planar surface for wafer support that retains superior insulating properties.

A feature of the invention is that gas may be fed from the rim only, diffusing within interstices between the clamping surface and the wafer and maintaining a desired pressure by flowing radially through an impedance determined by the average spacing between clamping surface and wafer, thereby providing uniform pressure across the clamping surface without the use of elastomeric seals.

DETAILED DESCRIPTION OF THE INVENTION

Figure 1:
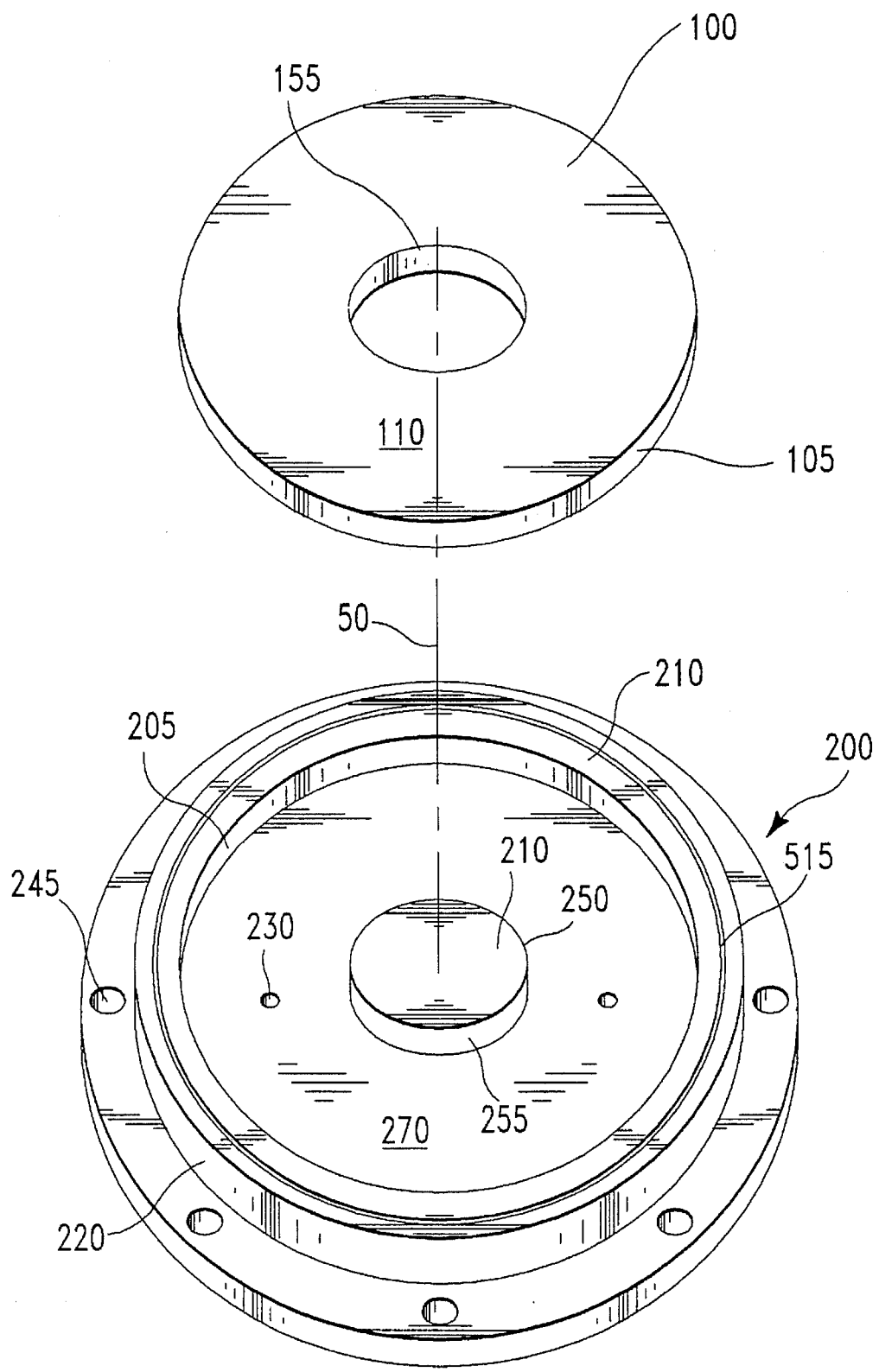
FIG. 1 illustrates in perspective an exploded view of a chuck according to the invention.

Referring now to FIG. 1, there is shown in exploded view, a bipolar or split electrode electrostatic chuck, in which base electrode 200, the larger portion of the chuck, has an electrode recess 270 machined in it to hold second electrode, or ring electrode, 100, ring electrode 100 being displaced along axis 50 in order to illustrate the chuck with greater clarity. Electrode 200 has a raised center hub 250 that defines, together with rim 220 of base electrode 200 a top surface 210. As is known in the art, bipolar chucks attract semiconductor wafers or other workpieces to surface 210 by electrostatic attraction of induced charges on the lower surface of the workpiece and fringing fields extending up to the workpiece from the capacitor formed by electrodes 100 and 200.

It is the purpose of the invention to provide a high clamping force on the workpiece by the use of a small gap between the electrodes that is formed between two thin layers of high quality dielectric while still retaining the advantage of the cited '964 chuck of having as planar a surface as possible over the entire face of the chuck.

Referring again to FIG. 1, it can be seen that ring electrode 100 has an inner vertical surface 155 that will have an inner recess gap between it and corresponding vertical surface 255 of center hub 250 after assembly. There is a corresponding pair of outer surfaces 105 and 205 that define a second outer recess gap. It is important, to provide consistency in clamping force, that these gaps be defined precisely and that they be repeatable. At the bottom of recess 270 there are illustrated two apertures 230 that are used to permit the passage of lifting pins to raise ring electrode 100 up so that top surface 110 is coplanar with surface 210 of base electrode 200. Two or more pins should be used. The initial thickness of electrode 100 is made to allow a coupling gap between the bottom of recess 270 (the oxidized recess depth) and the bottom of electrode 100 (i.e. allowing for an oxidized thickness of electrode 100) of nominal thickness 0.001" to 0.003", typically 0.002".

Figure 2:
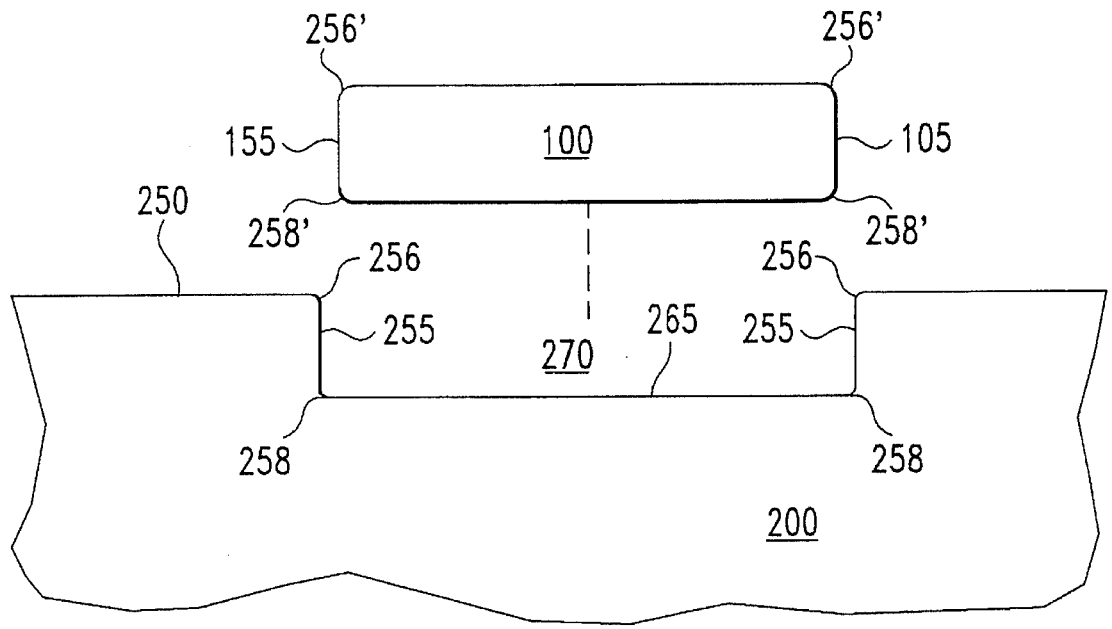
FIG. 2 illustrates a cross-section of a portion of the chuck of FIG. 1.

Referring now to FIG. 2, there is shown a cross-section of electrode 200 through recess 270. Ring electrode 100 is shown displaced for clarity. In recess 270, a top radius denoted by the numeral 256 is machined between surface 250 and surface 255. Illustratively, this surface has a radius of curvature of 0.015 inch. A corresponding bottom corner denoted with the numeral 258 between side surface 255 and bottom surface 260 has a radius of curvature of 0.060 inch. Preferably, these radii are machined by a numerically controlled lathe using carbide, ceramic, or diamond tooling. Corresponding radii for electrode 100 are 0.015 inch for radius 256' at the top and 0.090 inch for radius 258' on the bottom.

The final cut of electrode 200 in the preferred method is made in a profile operation with a nominal depth of cut of 0.002 inch and a turning rate of the workpiece to produce a smooth surface having a nominal finish of 2 microinches that facilitates the formation of a high quality dielectric coating. The full surfaces of electrode 100 are also final machined, with the top surface being machined to the same standard.

Figure 3:
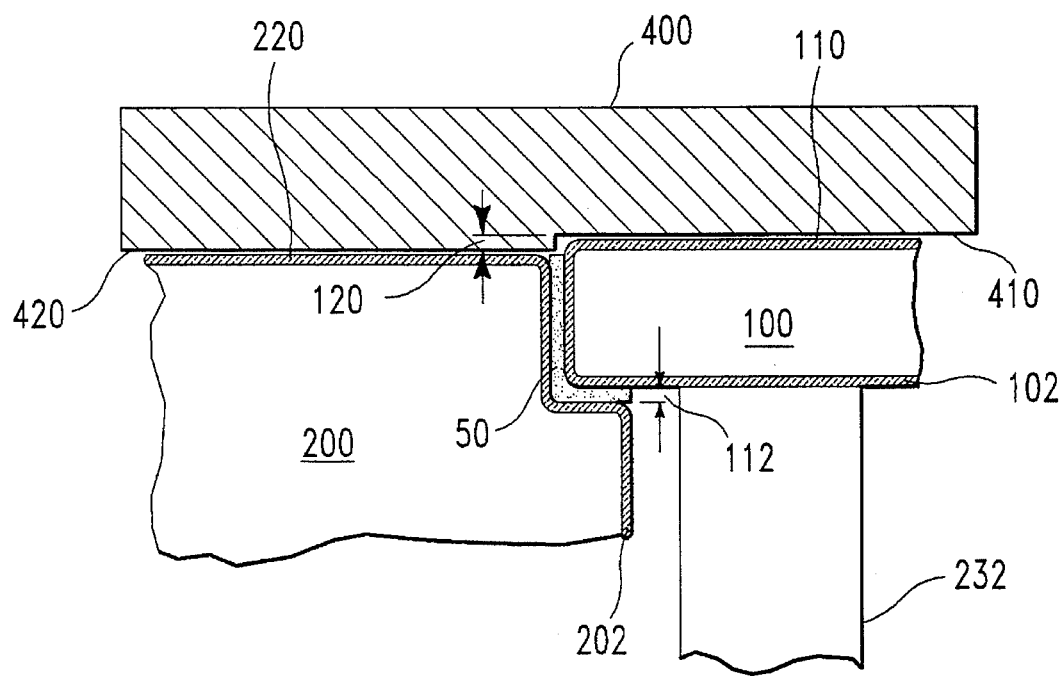
FIG. 3 illustrates in more detail a portion of the chuck in FIG. 1.

Referring now to FIG. 3, there is shown in more detail the two parts (electrodes 100 and 200) during the period of assembly. Both electrodes 100 and 200 have an oxidation surface layer denoted by the numerals 102 and 202, respectively, that is formed in a process such as the Alumilite (R) (registration of the Aluminum Company of America) process that, at a minimum, meets the requirements of military specification no. MIL-A-8625 Type III, Class 1 and produces a heavy, dense coating. For ease of reference, such a coating will be referred to as "hard-coat oxide" Aluminum alloy 6061-T6 is a preferable base material.

It has been found that it is important for the production of a heavy, dense oxide that the material be tested and extensive sampling is required in order to locate billets that are satisfactory. Those skilled in the art are aware that the processing steps, aging after fabrication, grain size and chemical composition all affect the quality of an oxide coating. The simplest method of selection is simply anodizing a test piece.

The main requirement of the insulation, whether it be hard-coat anodization, alumina, or any other insulator, is that the coating be as non-porous as possible, so that the electrical breakdown voltage of the insulator is as high as possible. The higher the breakdown voltage the smaller the gaps between the electrodes can be. Preferably, the breakdown strength should be at least 500 volts per mil. Insulators 102 and 202 are preferably applied to produce a final thickness of 0.002 in. Porosity is also important in this application. If the plasma can penetrate through the pores and contact an electrode, then there can be either an arc through the plasma or the electrode can be brought to the plasma potential, thereby declamping that electrode.

Returning to FIG. 3, a detail of the assembly process is shown. At the top of the figure, there is shown a partial cross-section of an assembly fixture 400 showing a step 120 between surface 410 opposing surface 110 and surface 420 opposing surface 220. The reason for this step is that it has been found that the bonding agent, preferably a thermally conductive, electrically insulating epoxy, such as H70S epoxy from Epoxy Technologies of Billerica, Mass., shrinks upon curing, so that ring electrode 100 is pulled back into recess 270 in electrode 200. Different epoxies or other insulators will shrink by different amounts, of course, and it may not always be necessary to raise the top surface 110 of ring 100 during the assembly process if the shrinkage is tolerable. A difference of height in the two surfaces of 0.0002 in has been found to be acceptable with respect to clamping force and gas leakage, both of which are affected by surfaces of differing heights. An electrode 100 that is uniformly recessed is preferable to one that projects or is tilted so that it projects on only one side because the outer edge of the wafer will then permit excessive gas leakage. The functional limitation is thus that the shrinkage be enough to recess ring 100 by an amount greater than zero and less than 0.0002 inch. A thick line denoted with the numeral 50 indicates the presence of the epoxy which has a nominal thickness of 0.002 inch, filling the nominal gap between electrodes 100 and 200. Tolerance on the oxide thickness is ±0.0002 inch and tolerance on the gap between layers 102 and 202 is ±0.002 inch. The tolerance on the diameters of the electrodes is illustratively +0.002 in for the inner diameter and 0.002 inch for the outer diameter of electrode 100 and correspondingly −0.002 inch for the inner diameter and +0.002 inch for the outer diameter of electrode 200.

At the lower portion of FIG. 3, there is shown a lifting pin 232 in aperture 230 which is used to press electrode 100 against surface 410. Illustratively, the electrode is mounted below fixture 400 and electrode 100 is pressed up, but the opposite orientation could also be used. This process is an alternative to that illustrated in U.S. Pat. No. 5,059,571 in which the top surfaces of electrodes 100 and 200 are machined after assembly. The second machining step produces superior planarity, but at the cost of forming a sharp corner on surfaces 256 and 256'. Those corners provided caused susceptibility to breakdown between the electrodes or to the wafer.

The thickness of ring electrode 100 is made smaller than the nominal depth of recess 270 to allow for a nominal gap, denoted by the bracket 112, of 0.002 inch between the bottom surfaces after the bonding step. Uniformity of this gap is relevant for plasma-assisted etching steps in which RF power is fed through the chuck to sustain the plasma. Since the RF will ordinarily be capacitively coupled through bottom gap 112 in the area of electrode 100, less power will be fed through in that area because of the impedance of this capacitor, and the etching process may be affected in this area if the process is highly sensitive to the amount of power. Different processes will have different power sensitivities and those skilled in the art will readily be able to measure the sensitivity of their processes. Chucks used in processes that do not have applied RF will not be affected by this consideration and may have larger gaps. Alternatively, each of electrodes 100 and 200 may be fed RF power directly through appropriate adaptive circuits.

Figure 4:
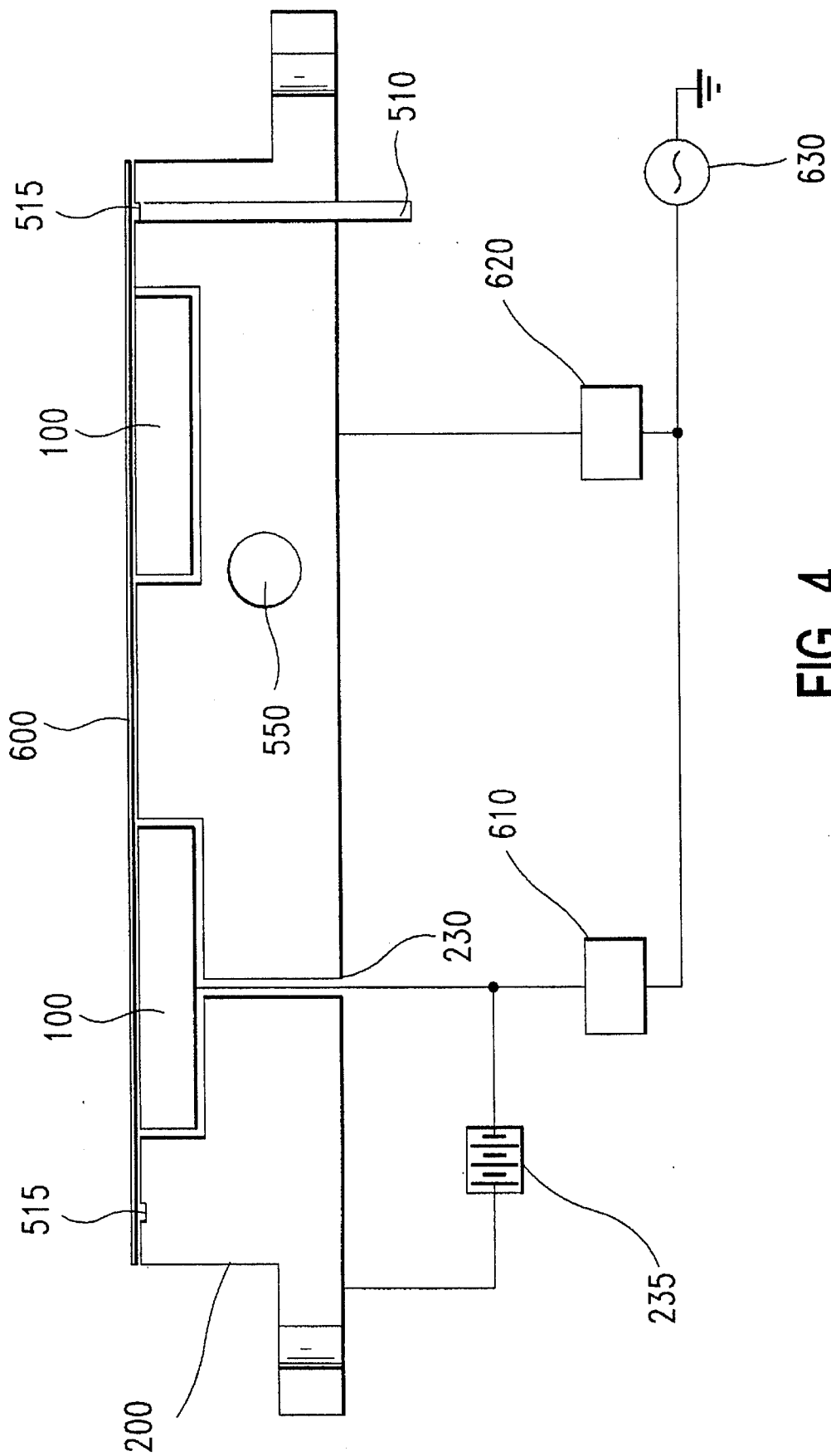
FIG. 4 illustrates in cross-section the chuck of FIG. 1 showing details of the gas cooling arrangement.

Referring now to FIG. 4, there is illustrated in cross-section, partially pictorially and partially schematically, a portion of a chuck according to the invention showing details of cooling passages for gas cooling of the workpiece. At the right of the figure, a gas, such as helium or argon, passes upwardly through channel 510 through electrode 200 into a channel denoted by the numeral 515 that passes around the rim of electrode 200. The heat transfer gas will diffuse in radially and azimuthally from passage 515 and then stop diffusing once the pressure within the interstices between the two surfaces is equal to that of passage 515. Since there is no impedance path in the interior along which gas can flow to an outlet, there can be no pressure drop and the pressure will necessarily be uniform.

Those skilled in the art will appreciate that the mechanism used herein to maintain the pressure between the chuck and the wafer at a nominal value (10 Torr, say) that is much greater than the nominal pressure of the chamber (order of magnitude 0.5 mTorr - 2 Torr) is that of flowing gas outwardly through the impedance of the short path between rim passage 515 and the ambient vacuum. Pressure within passage 515 is equal to the "impedance" of the constricted passages between wafer 600 and base electrode 200 times the flow, in analogy to Ohm's law. Thus, it can be seen that, given the impedance set by the roughness of the surfaces and the attractive force between the chuck and wafer 600, it is essential to flow a predetermined amount of gas sufficient to maintain the pressure in the desired range. This approach of maintaining flow in order to establish pressure is sharply different from such prior art as U.S. Pat. No. 5,103,367, showing the use of O-ring seals or other elastomeric seal to prevent any flow. Such seals are subject to attack by the plasma on the outer edge. The use of this method of supplying the gas is not restricted to aluminum electrodes or to the method of machining illustrated and applies to many chuck materials such as ceramics or refractory metals.

U.S. Pat. No. 4,512,931 shows a chuck using mechanical clamps and having a large chamber of thickness at least as great as the wafer (>0.02 inch) in which gas within the chamber can flow freely to equalize any pressure. Sealing is provided by mechanical clamps pressing the wafer with great force against a raised lip at the outer edge of the chuck that defines the gas chamber. Since clamping is applied only at the edges, the clamping pressure in the clamping area must be greater than the attracting pressure in an electrostatic chuck at least in the ratio of clamping areas. If the clamping pressure for an electrostatic chuck is 20 Torr (the pressure of the coolant gas that will pop the wafer off the chuck), then the total clamping force is 20 Torr×$A_{total}$, where $A_{total}$ is the total area of the chuck. For a mechanically clamped chuck to apply the same total force on a reduced clamping area $A_{clamp}$, the pressure in the clamping area must be 20 Torr($A_{total}/A_{clamp}$). For example, in the case of a 200 mm diameter chuck with a lip 5 mm wide, $A_{total}=\pi 100^2$ mm$^2$, $A_{clamp}=\pi(100^2-95^2)$mm$^2$, and the ratio $A_{total}/A_{clamp}=$ 10.3. Such a mechanically clamped chuck must exert a clamping pressure at least ten times as great as that of the electrostatic chuck and therefore will have a correspondingly better seal, since sealing is a monotonic increasing function of pressure.

Illustratively, the diameter of passage 510 is 0.030 inch for a nominal length of 0.375 inch and the diameter of passage 512 below it is 0.125 inch. Passage 510 should not support a glow discharge, so that conventional baffles or other means should be used to ensure that Paschen's law is not satisfied so that a glow discharge does not develop. Long runs of gas lines should be decoupled from the chuck (e.g. by the use of quartz tubing or insulated tubing and in cases packed with Teflon miniature tubing to reduce the exposed volume of gas.

Distribution passage 515 has a nominal depth of 0.020 inch and a radius of curvature where it meets the top surface 220 of electrode 200 of 0.010 inch and radii of curvature of 0.020 inch at the bottom. The intersection of groove 515 and passage 510 may be radiused if desired.

An advantage of this configuration of azimuthal distribution through a low impedance distribution groove about the periphery and radial distribution through diffusion compared with configurations having low impedance radial grooves connecting a set of circular grooves is that sharp corners are formed where grooves intersect and present a threat of arcing through the cooling gas to the wafer, the arcs being initiated by the high fields at the corners. Those skilled in the art can readily appreciate that many other configurations of gas coolant flow are known in the art. For example, a central aperture may be used as a feed, with the gas flowing radially into the ambient vacuum. This version has the disadvantage that the pressure will vary with radius and thus that there will be some variation in cooling efficiency.

Preferably, the gas pressure is such that the mean free path is considerably less than the average distance between surface 210 and the back of wafer 600. With this condition, referred to as the high pressure regime, the thermal conductivity of the gas film is substantially independent of pressure over a range from about one Torr up to atmospheric pressure. In the low pressure regime, where the mean free path is greater than or equal to the average distance, the thermal conductivity is an exponentially declining function of pressure. Operation in the low pressure regime is taught in U.S. Pat. No. 4,909,314. In contrast to the terminology of that patent, the terminology used here is the standard convention that "conduction" refers to heat transport by repeated molecular collision substantially without mass flow and "convection" refers to heat transport by the motion of energetic particles from one location to another, usually but not necessarily with net mass flow. Thus, in the low pressure regime, the heat transfer is by convection since a particle acquires energy at the hot wafer and travels to the cold base without collision where it gives up its energy when it collides with the base.

Aperture 550 represents a passage for cooling fluid, such as water, flowing perpendicular to the plane of the paper in this figure. The use of coolant water is optional, depending on the heat that must be removed from the workpiece by the chuck. On the left of the figure are found electrical connections for both DC voltage and RF power. The DC voltage is a nominal 600 volts applied between electrodes 200 and 100. The value can range broadly, depending on the application, from nearly zero to about 800 volts. The RF connection is a nominal 1000 watts at 13.56 MHz for a chuck diameter of 200 mm. The RF frequency and power will be determined by the manufacturer of the chamber in which the chuck will be mounted and will vary with the type of etching gas, the material being etched, the size of the wafer, and the size of the chamber. It is fed from generator 630 to two boxes labeled 610 and 620 which represent conventional impedance matching and power distribution subsystems that are connected to electrodes 200 and 100, respectively. A conventional DC power supply 235, isolated by low-pass filters as shown in FIG. 10*b*, supplies the DC bias. Those skilled in the art will readily appreciate that the RF power may be applied at various points to effect a balance between the power coupled to the plasma above electrode 200 and that coupled above electrode 100. For example, there may be a single feed to electrode 200 with capacitive coupling through gap 112 to electrode 100; there may be a direct connection to one of the electrodes with an impedance matching/power balancing system to the other electrode; or electrode 200 and/or 100 may be connected at number of points. The feed may be used to compensate for the extra capacitance between base electrode 200 and electrode 100 and therefore to make the power coupled into the plasma equal for the two electrodes or there may be a deliberate imbalance to compensate for the effects of the chamber dimensions which may require a greater power feed in some areas to maintain uniformity of the etching.

Use of the chuck is not confined to semiconductor wafers and it may be used with a number of different materials. It may be used in a materials handling system in which wafers or any other workpieces are to be picked and moved, generally referred to as pick and place systems.

An optional step that improves the chuck holding force is a burnishing step after the oxide has been formed and either before or after assembly. The chuck is placed on a granite surface block or other nonconductive smooth surface free of impurities and held down with a pressure of one to five pounds. Rubbing the chuck on the block for two minutes improved the gas leak rate by a factor of more than two. Holding force is conveniently measured by the gas pressure required to free the wafer from the chuck. Since the initial holding force is satisfactory, the voltage applied to the chuck electrodes can be reduced, placing less stress on the dielectric and resulting in longer life.

It has been found that at temperatures greater than 20° C. there is a substantial leakage current between electrodes 100 and 200 if a filled epoxy system of nominal thickness 0.001 inch to 0.002 inch is used as the bonding agent. This is surprising as both alumina and typical fillers such as boron nitride are good insulators. This leakage comes from mobile ions remaining after the anodization step that flow through the oxide coating, progressively weakening it. Preferably, an organic coating or an epoxy having a low ion mobility is used to block the flow. A film of polyimide (trade mark of dupont) 0.001" thick is inserted between electrodes 100 and 200 in order to reduce the leakage current along the vertical surfaces and below electrode 100. With this approach, a typical leakage current is reduced from > 10 µA to < 1 µA at 100° C. Dipping the electrodes in an organic material such as polyimide resin may also be used.

Figure 5:
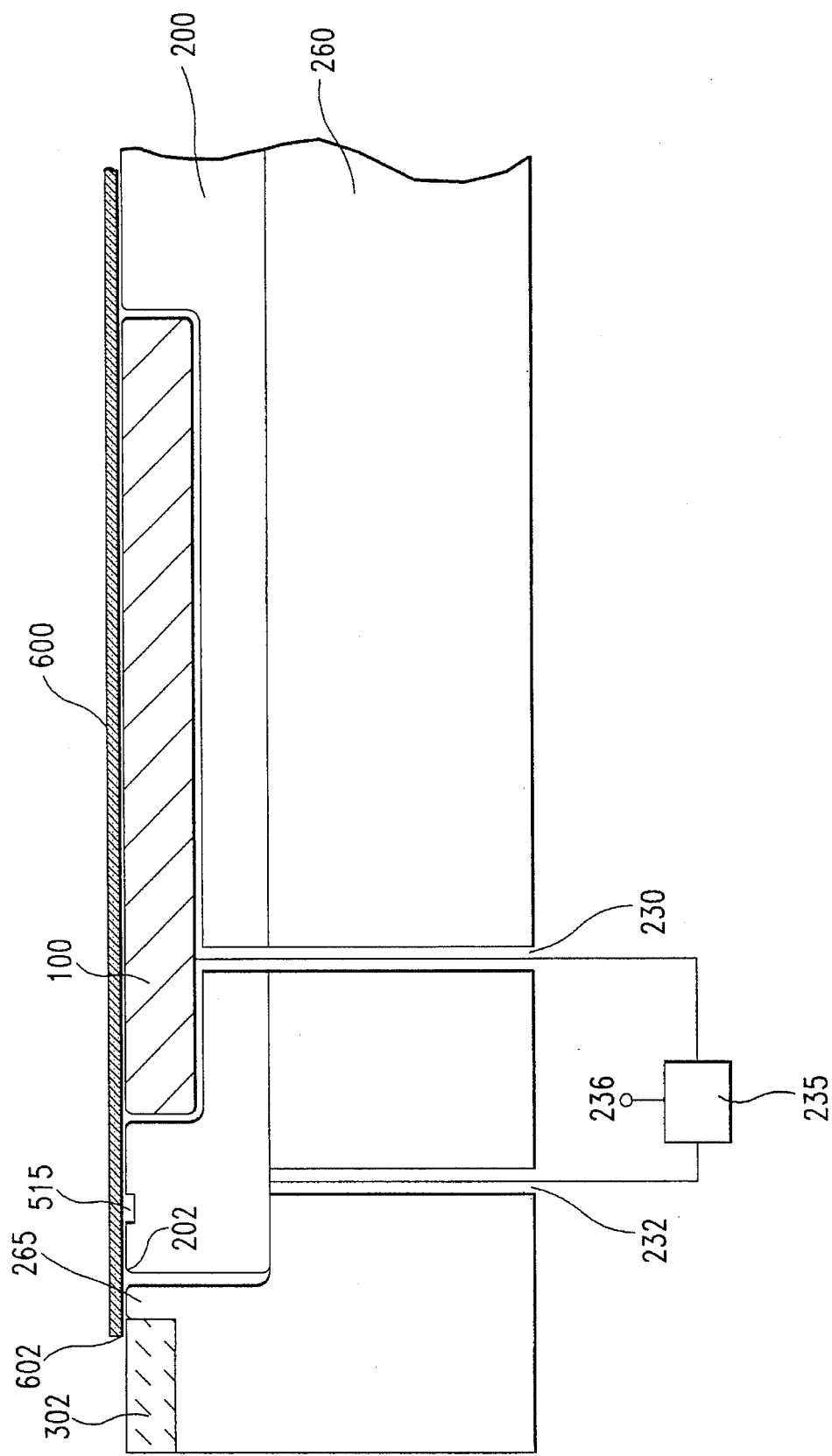
FIGS. 5 and 6 illustrate cross sections of alternative embodiments of the invention.

Referring now to FIG. 5, there is shown in partially pictorial, partially schematic form a cross section of a portion of an alternative embodiment of the invention in which electrodes 100 and 200 of the chuck are enclosed in a floating base 260. Since the chuck is symmetric, only one side is illustrated. Base 260 is isolated from electrode 200 and floats by capacitive coupling to a potential $V_{base}$ that is close to the wafer potential. Electrodes 100 and 200 are biased by supply 235 about the voltage on reference terminal 236, illustratively supplied by a circuit such as that illustrated in FIG. 10B. Wafer 600 is in contact with the plasma and therefore is at a time average "self-bias" potential $V_{ab}$ that is well below the plasma potential $V_p$. The exact voltage of the base will depend on the geometric details of the particular apparatus. The time-average plasma potential is always the highest in the system in order to maintain the electron cloud within the plasma. The walls of the vacuum chamber are conventionally at ground, with the chuck at some intermediate voltage depending on the ratio of a wall capacitance between the plasma and the wall and a wafer capacitance between the plasma and the wafer. Since the chuck is much smaller than the wall, and the RF currents through the two capacitors must be equal, the voltage drop over the sheath between the plasma and the chuck must be very much greater than the voltage drop over the wall sheath. (In some chambers having a very symmetric structure such as the Lam Research model 4520 $V_{ab}$ may be approximately zero.) Thus, the time-average voltage on the wafer $V_{ab}$ (substantially equal for both the front and back surface) will typically be less than ground. The two electrodes of the chuck will be biased at some potential above and below $V_{ab}$. The biasing may be done by preliminary tests or calculations to derive a bias value or by sensing the plasma voltage in real time and biasing the electrodes about that measured voltage.

In the embodiment illustrated in FIG. 5, floating guard ring 265 is insulated by a thin dielectric coating (preferably the same alumina as that coating electrodes 100 and 200) from the plasma, from chuck electrode 200, and from wafer 600 and the energy stored in the plasma. It will be at some potential close to $V_{ab}$. In a typical system, the time-average plasma voltage may be +100 V, the corresponding wafer potential (the self-bias potential) may be –300 V, and the electrodes 100 and 200 may be at 0 V and –600 V.

Without guard ring 265, the vertical portion of base 260, there will be vacuum arcs (an arc discharge through the vacuum between electrode 200 and wafer 600 or the plasma) caused by the high fields at corner 202 of electrode 200 and corner 602 of wafer 600. The plasma is rich in electrons and the alumina insulation on electrode 200 is porous, so that electrons can penetrate through the pores to the surface of the aluminum electrode, facilitating the initiation of a discharge. Both thermionic emission and instantaneous electric field contribute to initiating arcs. The primary purpose of guard ring 265 is to prevent arcs between the back corner of wafer 600 and/or the plasma in the corner region and electrode 200 by dropping the potential across a capacitance between electrode 200 and ring 265 (which is at or close to $V_{ab}$) and therefore both reducing the possibility that there will be a discharge and preventing the flow of electrons that would support an arc by physically blocking the path between the corners of the electrode and the surface.

In addition, ring 265 of base 260 is close in the vertical dimension to (nominally in contact with) the bottom of wafer 600, reducing the amount of plasma that may make contact with electrode 200 and thus prolonging the life of electrode 200. Since the heat transfer gas is flowing from passage 515 out into the vacuum through the confined space between ring 265 and wafer 600, those skilled in the art would expect that the gas would increase the danger of breakdown in that region, by providing a source of electrons and ions, as gases do in gas discharge apparatus.

There is a drawback to this arrangement in that RF coupling to the portion of wafer 600 above ring 265 is reduced compared to that above electrode 200 by the second capacitor that is introduced between electrode 200 and ring 265. Further, wafer 600 extends over the entire area of ring 265 and there is a deliberate overhang of wafer 600 above dielectric shaping ring 302 that reduces the RF power in that area still further. This overhang reduces the exposure of ring 265 to the plasma, but at the cost of reduced coupling. In a preferred embodiment, the width of guard ring 265 is 1–1.5 mm and the overhang of wafer 600 over shaping ring 302 is 2 mm. In addition, shaping ring 302 serves to shape the fringing RF fields passing into the plasma so that etching uniformity is improved at the rim of the wafer. Suitable materials for shaping ring 302 are alumina or quartz, the horizontal dimension of ring 302 being set to shape the field above the wafer by providing an offset from ground or other low potential, so that the electric field above the wafer remains perpendicular to the surface being etched. The thickness of ring 302 is set to reduce the coupling to the plasma above ring 302 relative to that above wafer 600 so that the plasma is only weakly energized in that area and ring 302 is etched only very slowly. The choice of materials is affected not only by corrosion resistance but also by non-interference of the reaction products that result from etching the ring during processing. There is a frequency-dependent coupling at the edge of the wafer caused by the frequency-dependent conductivity of the wafer. For typical lightly doped substrates having a dopant concentration of $10^{13}/cm^3$ the wafer has a very high RF conductivity at 400 kHz, a moderate conductivity at 13.5 MHz and a poor conductivity at 40 MHz.

Figure 6:
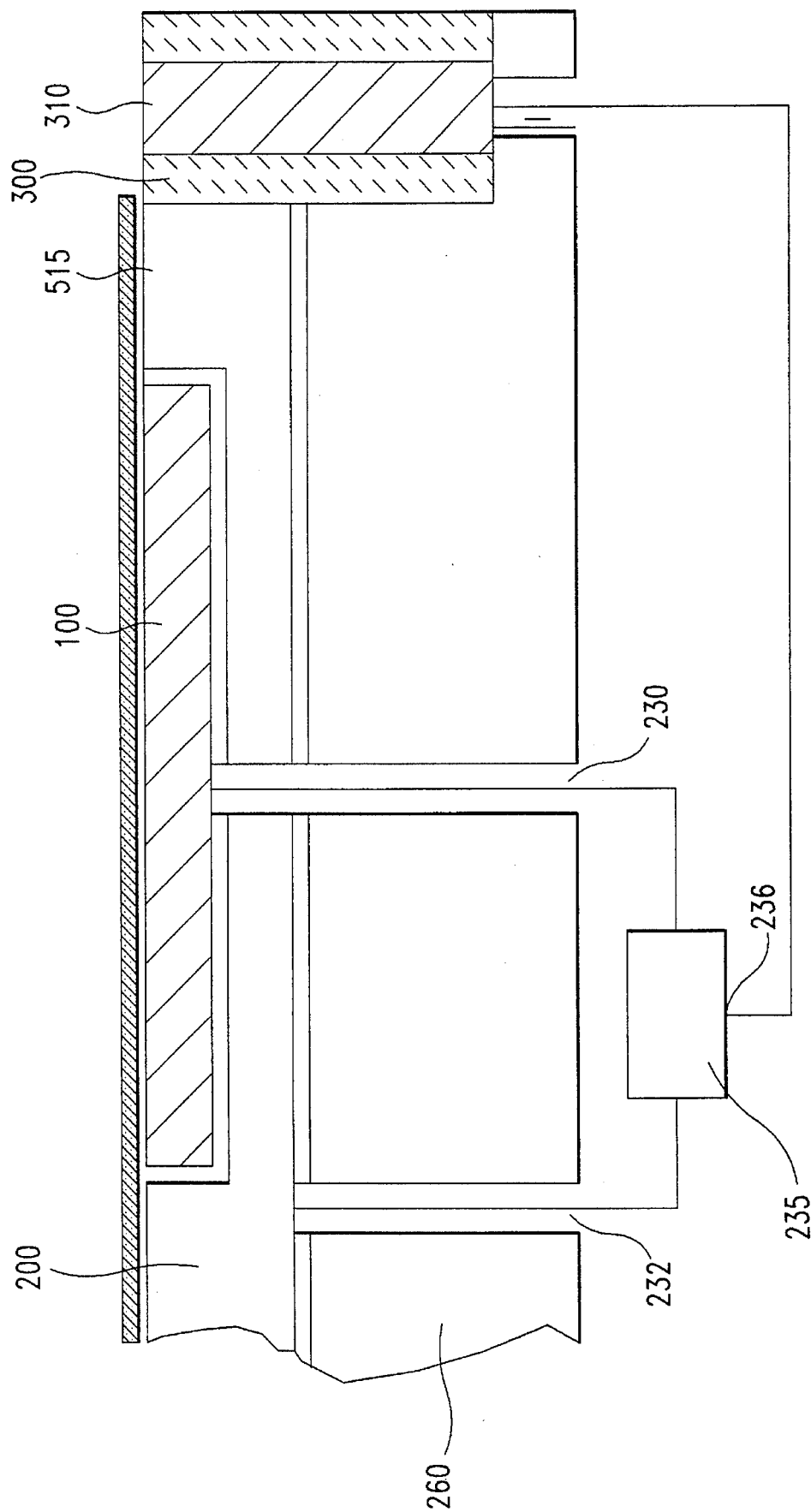

Referring now to FIG. 6, there is shown an alternative embodiment of the invention in which electrodes 100 and 200 are biased about $V_{ab}$. On the right of FIG. 6, a dielectric ring 300 has one or more holes in it for the passage of a conductive element 310 that is in contact with the plasma. Preferably, element 310 is made from a corrosion resistant material such as graphite, doped Si or SiC, depending on the chemistry of the plasma. Element 310 need not be a good conductor, since it only passes on $V_{ab}$ and draws very little current. The material of ring 300 may be alumina, quartz or any other durable dielectric. Bias source 235 is referenced on terminal 236 to bias electrodes 100 and 200 symmetrically with respect to the $V_{ab}$. In an example, the plasma voltage is +100 V, the self-bias voltage on wafer 600 is 300 V and the voltage between electrodes 100 and 200 is 600 V, the voltage on electrodes 100 and 200 will be 0 V and –600 V, respectively. It is an advantageous feature of the invention that the bias is thus auto-referencing and auto-adjusting, since in some processes, the $V_{ab}$ can change during the process. Those skilled in the art will appreciate that the bias voltage could be asymmetric, if desired. For example, since the gas seal on the rim is a function of voltage, it may be advantageous in some applications to increase the voltage on the rim.

Figure 10A:
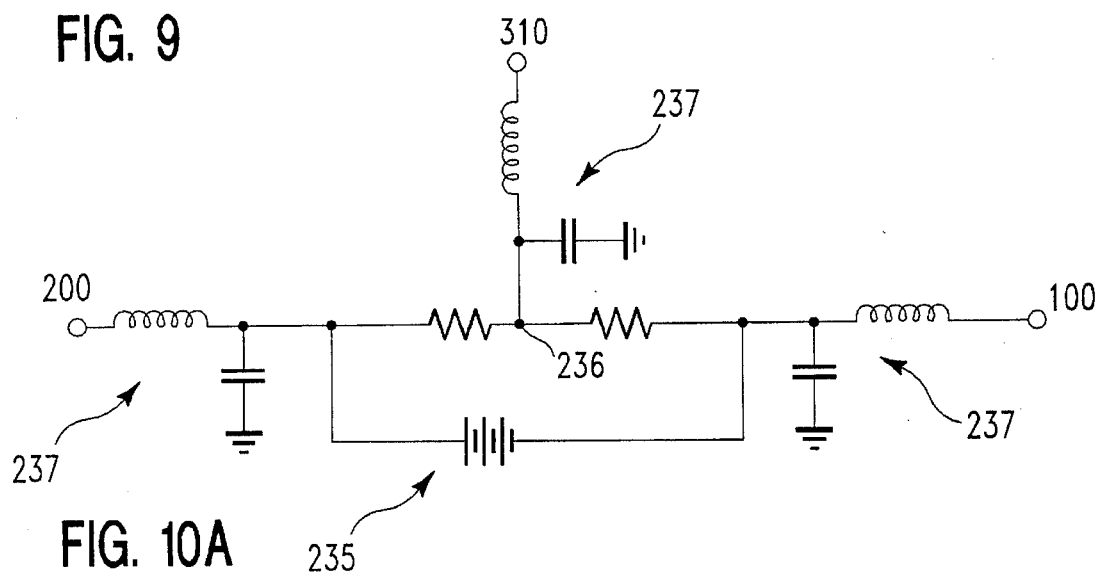
FIG. 10A illustrates a power supply for use with the invention.
Figure 10B:
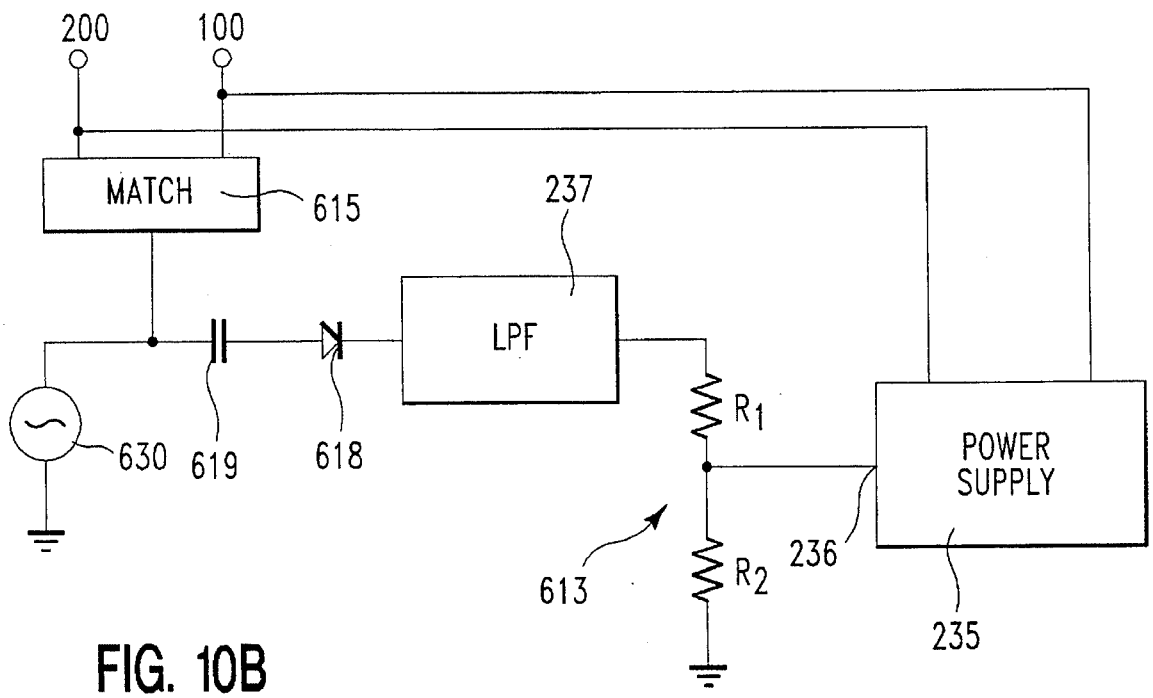
FIG. 10B illustrates a bias circuit for use with the invention.

An alternative method of controlling the bias is illustrated in FIG. 10b, in which electrodes 100 and 200 are biased from DC supply 235, illustrated in FIG. 10a, with the RF being fed from generator 530 through conventional matching network 615. in place of on electrode in contact with the plasma, a coupling capacitor 619 and diode 618 pass on a small amount of power for monitoring purposes through low pass filter 237 to resistor chain 613. A tap or the resistor chain feeds a reference to supply 235. The ratio of R1 and R2 in resistor chain 613 is set empirically during initial calibration to provide the desired bias, symmetric or asymmetric as the case may be.

In prior art chucks such as that illustrated in U.S. Pat. No. 4,554,611, the combination of dielectric and wafer was such that there was a significant decay time after the removal of a DC attracting voltage before the wafer could be removed since the very high voltages and dielectric materials used for early chucks caused mobile ions in the dielectric to be trapped polarizing the dielectric. The system described in U.S. Pat. No. 5,103,367 uses AC drive on the attracting electrodes to alleviate the problem by returning the field to zero repeatedly, thus preventing the formation of a persistent polarization from mobile ions that may be present. If an AC drive were used with the present invention, the pressure of the cooling gas would pop the wafer off the chuck when the voltage dropped below the value that balances the force from the gas pressure. With a 200 mm wafer and a gas pressure of 10 Torr, the voltage required to balance the gas pressure is 200–300 V.

In a system according to the invention, retention of the clamping force is not a problem and there is far more concern with dielectric breakdown between the electrodes and the wafer. With the very thin dielectric used in the present invention, there is a fine balance between the thickness of the dielectric and the danger of breakdown. As is known, the clamping force is proportional to $(V/d)^2$, where V is the voltage and d is the dielectric thickness. Thus, if the thickness is doubled, so must the voltage, in order to maintain the same clamping force and there is no gain in breakdown resistance. It has been found, contrary to the teachings of the art, that the combination of RF voltage and clamping voltage can cause dielectric breakdown between the wafer and the electrode. This was not a problem in prior art systems that either used very high voltages with correspondingly strong dielectrics and if they used RF, did not feed the RF through the same insulating area as the clamping voltage.

Those skilled in the art will appreciate that the stress on the hard-coat insulation will be frequency-dependent, since there will be an RF voltage superimposed on the DC clamping voltage. In some applications, the RF voltage across the capacitance between the electrode and the wafer ($\propto 1/\omega C$) together with the DC clamping voltage can exceed the breakdown voltage of the insulator. The danger of this is greatest for low frequency systems, such as the Lam system 4520, in which the plasma is driven at 400 KHz.

For example, in a system according to the invention in which the capacitance between the base and the wafer is approximately 6,000 pf, an RF power signal of 400 KHz and a nominal RF current of 2–3 A will produce an RF voltage across the insulator of 200–400 V.

Figure 8:
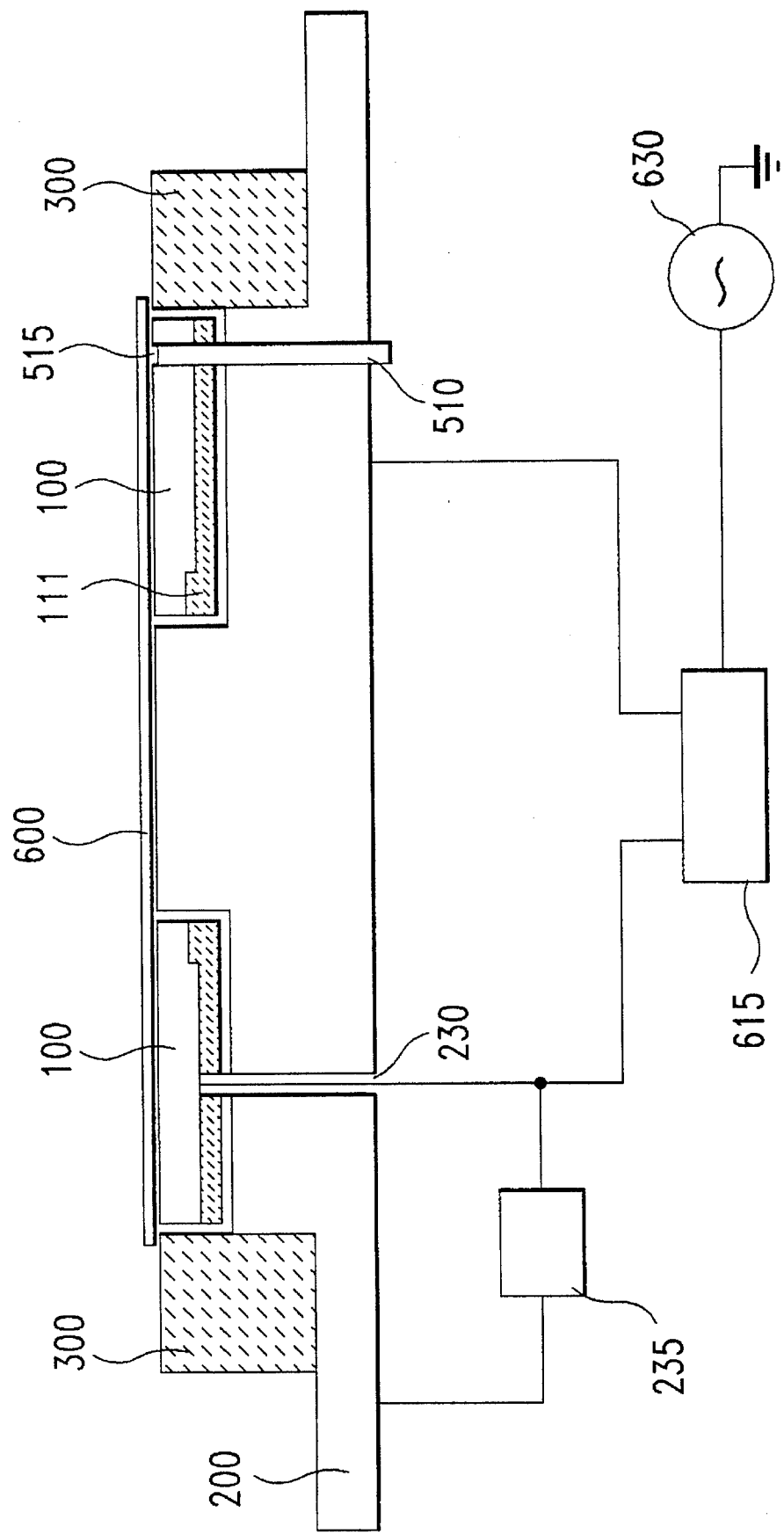
FIG. 8 illustrates an alternative embodiment having decoupled RF electrodes.

The Horwitz reference also teaches a preferred RF embodiment differing substantially from that of the present invention. In FIG. 8, it discloses thin film insulators as a preferred embodiment for RF applications. Nothing is taught about how the RF is fed through the chuck into the plasma, whether it is through direct contact with the electrodes or by capacitive coupling through the RF -reference electrode. In that system, also, the extensive area of the RF reference electrode outside the wafer means that the plasma will be driven more strongly outside the wafer than above it, which is a disadvantage that greatly increases corrosion of the RF reference electrode and interferes with the etching process.

Figure 7C:
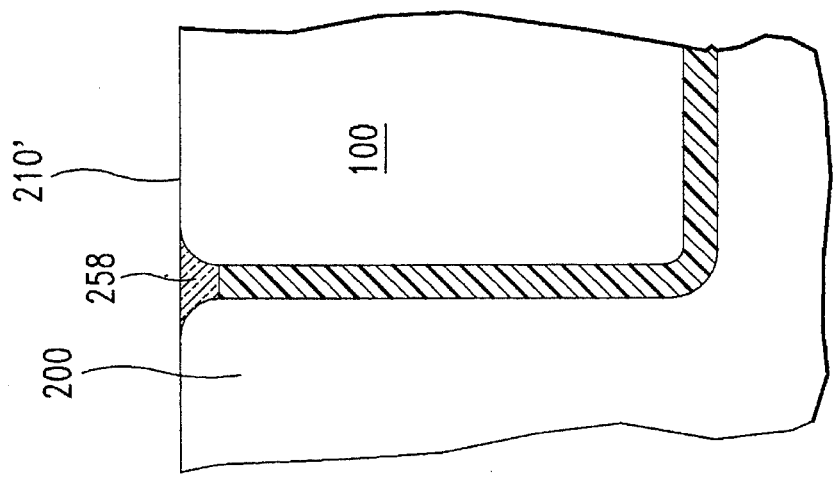
FIGS. 7A–7C illustrate steps in an alternative method of assembling a chuck.
Figure 7B:
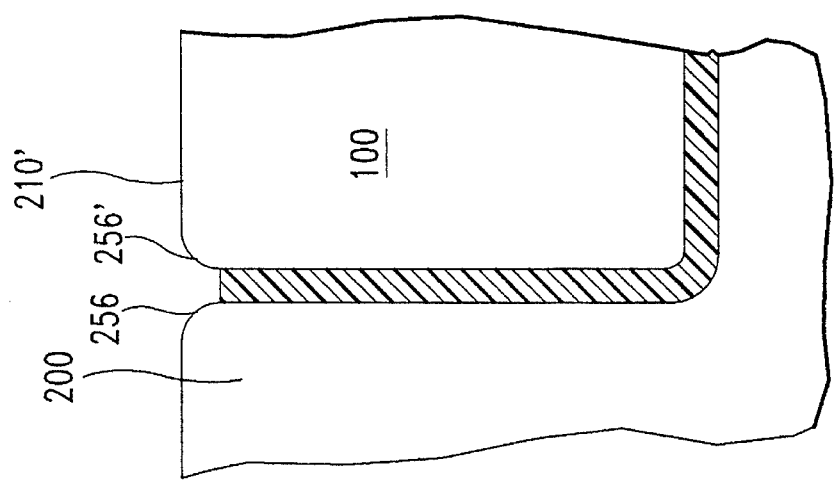
Figure 7A:
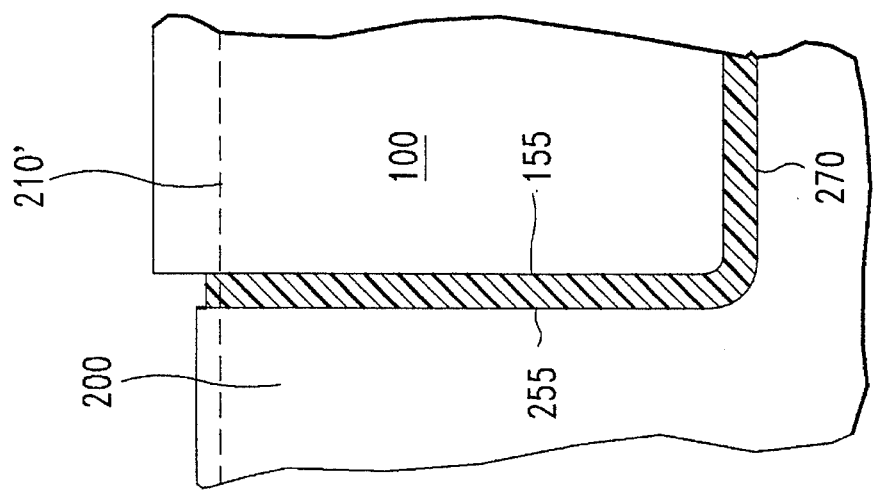

Referring now to FIG. 7, there is shown a detail of an alternative embodiment of the chuck, in which the top surfaces of electrodes 100 and 200 are machined to final size after assembly. This method is an improvement on the method of the cited '964 patent as described below. The area shown is the joint between electrodes 100 and 200, near the center of the chuck. In FIG. 7a, oversized electrodes 100 and 200 have been aligned and bonded together after an initial anodization step in which the top surfaces 110 and 210 were masked off. Surfaces 255 and 155 have been anodized as has the bottom of pocket 270 and the bottom of electrode 100. This bottom anodizing step is optional, depending on the quality of the insulation used and the degree of current leakage that can be tolerated. After alignment as described below, the electrodes have been bonded with an electrically insulating epoxy 254 such as H70S. As can be seen in FIG. 7A, the epoxy has been filled above line 210' that will be the final top surface of the electrodes.

In the next figure, 7B, the top of both electrodes has been finish machined to a finish of four microinches (approaching two microinches) and radii 256 and 256' have been machined. In the machining step, the anodization coating was first scored with a diamond scribe and then a plunge cut operation was performed in which a tool having the appropriate radius (256, 256') is plunged into the epoxy and moved about the circumference of electrode 100. In the example, radius 256 was 0.030 inch. One skilled in the art would not think to machine off the coating because it is known that machining hard coat anodization results in a rough surface because the coating is brittle and tears off instead of being machined smoothly. The machining could be extended further inward to give a new smooth surface, but there would then be greater horizontal step in the vertical surface caused by a) the extra machining and b) by the fact that the oxide forms by growing into the aluminum. Such a step is of course undesirable because there will be high field strength at the step, with an attendant increase in the danger of current leakage. In addition, the interface between the new and old epoxies, which will have a lower resistance for current leakage because the bond between the two epoxies will not be as uniform as the bonds within the volume of an epoxy mass, will be at the vertical position of the steps. There will inevitably be some step or sharp change in radius because at least a minimum amount of aluminum must be removed. The radii 256 and 256' may be chosen to be different so that the steps will be separated by a vertical amount. In addition, one skilled in the art would be aware that aluminum particles will be generated in the machining process and may become lodged in the epoxy, giving rise to a weak spot that will provide electrical breakdown. Chips may be picked out manually and/or a secondary plunge cut removing only epoxy may be done after machining radii 256, 256' to remove remaining aluminum chips and also to lower the joint between old and new epoxy so that the bond line is not at the same height as the discontinuity between old and new anodization.

The sequence of steps is:

1. Rough machine the outer dimensions of electrodes 100 and 200.

2. Finish machine pocket 270; jig-bore center dowel pin in electrode 200.

3. Finish machine 155, 255 and bottom of 100; jig-bore dowel pin locating holes in electrodes 100 and 200.

4. Anodize pocket 270 surfaces 155, 255, and bottom of 100. Mask top surfaces of electrodes 100 and 200.

5. Score a line with a diamond tool bit at the base of the area to be plunge cut. Coat anodized surfaces with polymide. Optionally machine off the hard coat anodization above the diamond scribe line.

6. Bond electrodes 100 and 200 using dowel pin alignment and ( <1 microamp techniques )

7. Plunge cut machine radii 256 and 256'; finish machine surfaces 210' and all remaining outer surfaces of the chuck.

8. Anodize surfaces 210' and outer surfaces of chuck;

9. Seal plunge cut radii with thermally conductive electrically insulating epoxy.

Optionally a polyimide sheet may be inserted between the electrodes if the temperature will be above 20 degrees C.

Referring now to FIG. 8, there is illustrated another embodiment in which the electrodes 100 and 200 are electrically decoupled, in contrast to the earlier versions in which RF power was transmitted to the "donut" electrode 100 by capacitive coupling. In this version, isolation ring 111, illustratively formed from alumina, boron nitride or any other insulator with relatively good thermal properties, has a vertical thickness sufficient to decouple the electrodes. In the version of FIG. 6, there would be two steps at the inner and outer edges of the ring. For the 200 mm chuck illustrated, the capacitance between the electrodes is preferably less than 500 pf. The shape of ring 111 is not a simple ring, but has a higher portion on the inner radius. The reason for this extra-cost option is to reduce the capacitance between electrodes 100 and 200 to tailor the RF power distribution.

The radial gap between the electrodes should be relatively small, (0.020") in order to have strong fringing fields for a good grip on the workpiece, but a close gap increases the capacitance. The ring is not extended up to the surface because of the above constraint from the fringing fields and also because the thermal conductivity of ceramic is much less than that of aluminum, so that there would be a radial temperature discontinuity if the ceramic did extend up to the surface. Those skilled in the art will appreciate that the final dimensions will depend on the usual engineering tradeoffs, including the sensitivity of the process to radial differences in coupled RF power, differences in temperature and wafer clamping force. In the embodiment illustrated, ring 111 was 0.125 inch thick in the main portion and was 0.340 inch thick in the inner portion. The nominal thickness of electrode 100 at the inner radius was 0.125 inch.

Figure 9:
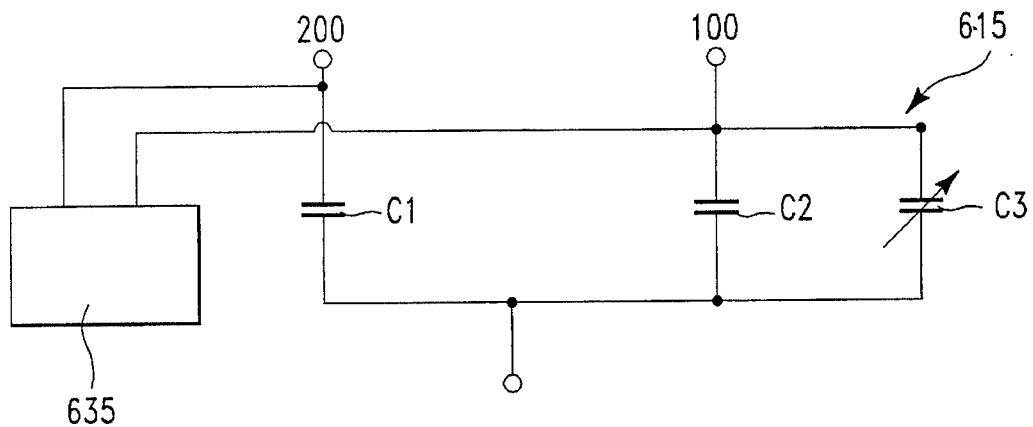
FIG. 9 illustrates a decoupling circuit for use with the invention.

Note that this embodiment lacks the outer rim 210 of the embodiment of FIG. 1, so that the gas feed groove 515 is in electrode 100. The embodiment also has a shaping ring 300. A sensing electrode 310, as shown in FIG. 6, could also be used. The box labelled 615 represents the coupling circuit illustrated in FIG. 9, in which DC power supply 635, isolated by RF chokes and capacitively shunted to ground in a conventional fashion, is connected to electrodes 100 and 200 in parallel with a capacitive coupler in which a small fixed capacitor C2 is in parallel with a variable capacitor C3 that is used to tune to compensate for radial variations in plasma generation caused by non-uniform fields reflecting the geometry of the chamber that affect the plasma above electrode 100 differently from that above electrode 200. There is a frequency-dependent conductivity of the wafer that implies that the system will work better at higher frequency.

Those skilled in the art will readily appreciate that different embodiments can be made within the spirit and scope of the invention and the following claims are not intended to be limited to the embodiments illustrated.

We claim:

1. A method of manufacturing an electrostatic chuck for holding a workpiece by electrostatic attraction comprising the steps of:

machining a base electrode from an aluminum alloy, said base electrode having an electrode recess machined in a top surface thereof for receiving a second electrode, said recess having inner and outer recess side surfaces connected to said top surface by transition regions having a first radius of curvature and a recess bottom surface at a recess depth below said top surface and connected to said recess side surfaces by second transition regions having a second radius of curvature, thereby defining a recess transverse distance;

machining said second electrode to match said recess with a second transverse distance related to said recess transverse distance and a second thickness related to said recess depth;

after said steps of machining said base and second electrodes, oxidizing both said base electrode and said second electrode with an electrode thickness of aluminum oxide, so that said base electrode has an oxidized recess with an oxidized recess transverse distance and an oxidized recess depth and said second electrode has an oxidized second transverse distance and an oxidized second thickness, said thickness of aluminum oxide, said recess transverse distance and said second transverse distance being related such that inner and outer recess gaps are present between said base electrode and said second electrode when said base and second electrodes are assembled;

coating at least one of said recess side surfaces and said second electrode side surfaces with a bonding agent;

after said step of oxidizing said base and second electrodes, assembling said base and second electrodes and forcing said base and second electrode top surfaces against corresponding reference base and second electrode surfaces of a reference fixture, said second electrode surface of said reference fixture being positioned with respect to said base surface of said reference fixture by an offset amount such that said top surface of said second electrode extends past said top surface of said base electrode by a shrinkage amount and such that said top surface of said second electrode is positioned with respect to said top surface of said base electrode by said shrinkage amount, whereby said bonding agent shrinks to retract said top surface of said second electrode to a final position below said top surface of said base electrode.

2. A method according to claim 1, in which said step of machining said base and second electrodes includes machining at least one azimuthal gas distribution groove in a top surface of at least one of said base and second electrodes without a radial gas distribution groove, whereby there is no low-impedance radial path for gas flow along said clamping surface.

3. A method according to claim 2, further including a step of separating said second electrode from said base electrode by a decoupling insulator having a decoupling thickness sufficient to reduce RF power capacitively coupled between said base and second electrodes below a threshold amount.

4. A method according to claim 1, further including a step of separating said second electrode from said base electrode by a decoupling insulator having a decoupling thickness sufficient to reduce RF power capacitively coupled between said base and second electrodes below a threshold amount.

5. A method of manufacturing an electrostatic chuck for holding a workpiece by electrostatic attraction comprising the steps of:

machining a base electrode from an aluminum alloy, said base electrode having an electrode recess machined in a top surface thereof for receiving a second electrode, said recess having inner and outer recess side surfaces connected to said top surface by transition regions having a first radius of curvature and a recess bottom surface at a recess depth below said top surface and connected to said recess side surfaces by second transition regions having a second radius of curvature, thereby defining a recess transverse distance; machining said second electrode to match said recess with a second transverse distance related to said recess transverse distance and a second thickness related to said recess depth;

after said steps of machining said base and second electrodes, oxidizing both said base electrode and said second electrode with an electrode thickness of aluminum oxide, so that said base electrode has an oxidized recess with an oxidized recess transverse distance and an oxidized recess depth and said second electrode has an oxidized second transverse distance and an oxidized second thickness, said thickness of aluminum oxide, said recess transverse distance and said second transverse distance being related such that inner and outer recess gaps are present between said base electrode and said second electrode when said base and second electrodes are assembled;

coating at least one of said recess side surfaces and said second electrode side surfaces with a bonding agent;

after said step of oxidizing said base and second electrodes, assembling said base and second electrodes with a strip of organic insulating film therebetween in said inner and outer recess gaps, so that said bonding agent bonds said insulating film to both said base and second electrodes and forcing said base and second electrode top surfaces against corresponding reference base and second electrode surfaces of a reference fixture, said second electrode surface of said reference fixture being positioned with respect to said base surface of said reference fixture such that said top surface of said second electrode is positioned with respect to said top surface of said base electrode by a shrinkage amount, whereby said bonding agent shrinks to retract said top surface of said second electrode to a final position below said top surface of said base electrode.

6. A method according to claim 5, further including a step of separating said second electrode from said base electrode by a decoupling insulator having a decoupling thickness sufficient to reduce RF power capacitively coupled between said base and second electrodes below a threshold amount.

7. A method of manufacturing an electrostatic chuck for holding a workpiece by electrostatic attraction comprising the steps of:

machining a base electrode from an aluminum alloy, said base electrode having an electrode recess machined in a top surface thereof for receiving a second electrode, said recess having inner and outer recess side surfaces connected to said top surface by transition regions having a first radius of curvature and a recess bottom surface at a recess depth below said top surface and connected to said recess side surfaces by second transition regions having a second radius of curvature, thereby defining a recess transverse distance;

machining said second electrode to match said recess with a second transverse distance related to said recess transverse distance and a second thickness related to said recess depth;

oxidizing both said base electrode and said second electrode with an electrode thickness of aluminum oxide, so that said base electrode has an oxidized recess with an oxidized recess transverse distance and an oxidized recess depth and said second electrode has an oxidized second transverse distance and an oxidized second thickness, said thickness of aluminum oxide, said recess transverse distance and said second transverse distance being related such that inner and outer recess gaps are present between said base electrode and said second electrode when said base and second electrodes are assembled;

coating at least one of said recess side surfaces and said second electrode side surfaces with a bonding agent;

assembling said base and second electrodes and forcing said base and second electrode top surfaces against corresponding reference base and second electrode surfaces of a reference fixture;

in which said step of machining said base and second electrodes includes machining at least one azimuthal gas distribution groove in a top surface of at least one of said base and second electrodes without a radial gas distribution groove, whereby there is no low-impedance radial path for gas flow along said clamping surface.

8. A method according to claim 7, further including a step of separating said second electrode from said base electrode by a decoupling insulator having a decoupling thickness sufficient to reduce RF power capacitively coupled between said base and second electrodes below a threshold amount.

* * * * *